(12) United States Patent
Joodaki

(10) Patent No.: US 7,705,420 B2
(45) Date of Patent: Apr. 27, 2010

(54) METHOD FOR PRODUCING A CONDUCTOR PATH ON A SUBSTRATE, AND A COMPONENT HAVING A CONDUCTOR PATH FABRICATED IN ACCORDANCE WITH SUCH A METHOD

(75) Inventor: Mojtaba Joodaki, Munich (DE)

(73) Assignee: Atmel Automotive GmbH, Heilbronn (DE)

( * ) Notice: Subject to any disclaimer, the term of this patent is extended or adjusted under 35 U.S.C. 154(b) by 748 days.

(21) Appl. No.: 11/122,038

(22) Filed: May 5, 2005

(65) Prior Publication Data

US 2005/0248001 A1 Nov. 10, 2005

(30) Foreign Application Priority Data

May 5, 2004 (DE) .................. 10 2004 022 178

(51) Int. Cl.
*H01L 29/86* (2006.01)
(52) U.S. Cl. .................. 257/531; 257/E23.068
(58) Field of Classification Search .................. 257/211, 257/620–621, 414–416, 528–531, E23.067; 73/31.05
See application file for complete search history.

(56) References Cited

U.S. PATENT DOCUMENTS

| | | | | |
|---|---|---|---|---|
| 5,237,867 A | * | 8/1993 | Cook, Jr. .................. | 73/204.15 |
| 5,605,612 A | * | 2/1997 | Park et al. .................. | 204/429 |
| 5,804,462 A | * | 9/1998 | Liu et al. .................. | 438/53 |
| 5,866,800 A | * | 2/1999 | Park et al. .................. | 73/31.06 |
| 6,243,474 B1 | * | 6/2001 | Tai et al. .................. | 381/174 |
| 6,300,670 B1 | * | 10/2001 | Kramer et al. .................. | 257/621 |
| 6,366,639 B1 | * | 4/2002 | Ezaki et al. .................. | 378/34 |
| 6,644,113 B2 | * | 11/2003 | Kawai et al. .................. | 73/204.26 |
| 6,698,283 B2 | * | 3/2004 | Wado et al. .................. | 73/204.26 |
| 2001/0029060 A1 | | 10/2001 | Fukada et al. | |
| 2002/0181725 A1 | * | 12/2002 | Johannsen et al. .................. | 381/174 |
| 2004/0075967 A1 | | 4/2004 | Lynch et al. | |
| 2005/0109081 A1 | * | 5/2005 | Zribi et al. .................. | 73/31.05 |
| 2006/0154401 A1 | * | 7/2006 | Gardner et al. .................. | 438/53 |

FOREIGN PATENT DOCUMENTS

EP 0845831 A2 3/1998

OTHER PUBLICATIONS

Linda P.B. Katehi et al., Micromachined Circuits for Millimeter- and Sub-millimeter-Wave Applications IEEE Antennas and Propagation Magazine, vol. 35, No. 5 Oct. 1993 p. 9-17.

* cited by examiner

*Primary Examiner*—Nathan W Ha
(74) *Attorney, Agent, or Firm*—Muncy, Geissler, Olds & Lowe, PLLC

(57) ABSTRACT

A component having at least one conductor path on a substrate, and a production method for fabricating such a component is provided. The component is made by providing at least one conductor path on a predefined area of the substrate. Then a dielectric insulating layer is formed over the at least one conductor path, and a an area of the substrate is completely back etched below the at least one conductor path beginning on the bottom side of the substrate in such a way that the at least one conductor path is supported across the completely back-etched area of the substrate by adhesion to the second insulating layer.

20 Claims, 4 Drawing Sheets

METHOD FOR PRODUCING A CONDUCTOR PATH ON A SUBSTRATE, AND A COMPONENT HAVING A CONDUCTOR PATH FABRICATED IN ACCORDANCE WITH SUCH A METHOD

This nonprovisional application claims priority under 35 U.S.C. § 119(a) on German Patent Application No. DE 102004022178.2, which was filed in Germany on May 5, 2004, and which is herein incorporated by reference.

BACKGROUND OF THE INVENTION

1. Field of the Invention

The present invention relates to a method for producing at least one conductor path on a substrate, and a component having at least one conductor path that is fabricated in accordance with such a method.

Although it is applicable for any conductor path, the present invention describes in detail both the basic problems associated with it in regards to a conductor path for the electrical connection of two electronic components, for example, for two passive components, which are used in a high frequency field. This requires conductor paths on the substrate that are able to provide an interference-free transmission in the high frequency field.

2. Description of the Background Art

In general, undesirable parasitic interferences and electromagnetic losses occur due to interconnection contact of the conductor paths with the substrate. In addition, interferences of neighboring conductor paths can occur due to the respective couplings of the conductor paths with the substrate.

At low frequencies, the influence of the conductor paths on the component characteristics is only minimal, however, at higher frequencies, particularly in the high frequency field, the electromagnetic effects of the conductor paths on the performance of the component can no longer be ignored. In each integrated circuit, for example, active and passive components are interconnected via conductor paths, whereby the power dissipation of these conductor paths should be as minimal as possible, and the conductor paths should be integratable on a shared carrier substrate in a simple way. The dissipation sources can be divided into three categories: ohmic dissipation, dielectric dissipation, and losses due to electromagnetic emission. The development of substrate-integrated conductor paths with minimal losses is extremely important for the use of integrated circuits in the high frequency field that is based on silicon technology. In the high frequency field, the losses resulting from the coupling of the conductor paths with the substrate are of particular importance.

In conventional technology, various attempts to the reduce interference losses from substrate-integrated conductor paths have been made. For example, organic dielectric materials on the silicon substrate and organic or inorganic membranes below the conductor paths have been used to reduce coupling losses. It is known, for example, to construct a conductor path on a membrane, whereby the membrane is formed on the surface of the silicon substrate. According to the article, "*Membrane-Supported CPW with Mounted Active Devices*" by Wai Y. Liu, IEEE, MICROWAVE AND WIRELESS COMPONENTS LETTERS, Vol. 11, No. 4, Apr. 2001, pages 167 et sqq., the construction of a membrane-supported conductor path is described. The printed circuit is thereby constructed by using a photolithographic process on this membrane film. With selective etching processes, a decoupling of the membrane from the carrier material is achieved to reduce the interferences and losses resulting from the coupling of the membrane with the substrate.

However, the disadvantage of this approach proved to be the fact that such a production method is extremely complicated, time-consuming and costly. Furthermore, another negative fact of this approach is that in addition to the fabrication of the membrane, a covering for the top-exposed conductor path must be provided to protect it from exterior influences.

SUMMARY OF THE INVENTION

It is therefore an object of the present invention to provide a method for producing a protected conductor path on a substrate and a component having a conductor path that was produced in accordance with such a method that ensures a simple and cost-effective fabrication of a conductor path that is protected and decoupled from the carrier substrate.

The present invention is based on the idea to integrate the conductor paths in a dielectric membrane layer on the substrate in such a way that on the one hand, each freely suspended conductor path is supported across predefined, completely back-etched areas of the substrate by the corresponding membrane material through adhesion thereto, while at the same time being protected against external interferences by the corresponding membrane layer. Such a method for the construction of conductor paths on the substrate can include the following steps: construction of at least one conductor path on a predefined area of the substrate; deposition of a dielectric insulating layer, which serves as a membrane, over the conductor paths on the top side of the substrate; and the complete back-etching of predefined areas of the substrate below the respective conductor paths beginning at a bottom side of the substrate such that each conductor path is supported, freely suspended, across each of the completely back-etched substrate areas, by adhesion to the membrane, that is, the second insulating layer.

Compared to conventional technology, the present invention has the advantage that the conductor paths are freely suspended across the back-etched area of the substrate and a coupling between the conductor path and the substrate is avoided, or at least reduced. This results in low parasitic interferences. In addition, the membrane layer protects the conductor path due to an embedding feature of the invention, namely, embedding of the conductor path in the membrane. Thus, a component with at least one conductor path that is suspended from and protected by the membrane can be fabricated easier than a conventional component. This reduces both labor and production costs. Furthermore, the production method is compatible with silicon technologies for the high frequency field. Apart from the parasitic losses, the substrate losses in particular are substantially reduced. Compared to conventional production methods, the production method according to the present invention is, therefore, faster, simpler, and more cost-efficient and can also be realized by using a beneficial standard aluminum metallization.

In an example embodiment, an additional layer, particularly a first dielectric insulating layer, is formed on a top side of the substrate prior to the construction of the conductor paths. This additional layer can be beneficial in protecting the conductor path metallizations from possible etching agents.

In a further example embodiment, the complete back-etching of a substrate area below the respective conductor path can be done by a single wet chemical etching procedure, for example, by utilizing a third insulating layer. Alternatively, it can be beneficial to execute the complete back-etching of the substrate area below the respective conductor path in two consecutive etching steps. Preferably, the first etching step partially back-etches a substrate area below the respective conductor path in such a way that a thin substrate layer remains below the respective conductor path. In a subsequent second etching step, a segment of the previously formed thin substrate layer can be completely back-etched using, for example, a further wet chemical etching procedure, to form a staggered structure on the back-etched substrate area below the respective conductor path. By executing the two previously described etching steps, several conductor paths can be simultaneously constructed adjacent to one another on a small surface, whereby the not complete back-etched segments of the previously formed thin substrate layer ensure greater stability of the substrate surface. The first and second etching step in particular can be executed as wet chemical etching procedures. In the second etching step, for example, an additional insulating layer on the bottom side of the substrate and the surface of the partially back-etched segment can be deposited, whereby the fourth insulating layer can be structured by developing a vaporized photo-resistive material, for example, in order to ensure the desired anisotropic complete back-etching of a segment of the previously formed thin substrate layer. As a finishing treatment, the photo-resistive layers, for example, can be rinsed off with a suitable solution, for example, acetone, and the remaining insulating layers on the bottom side of the substrate can be removed through a wet chemical etching process, for example, or a dry etching procedure.

In a further example embodiment, a plurality of conductor paths are provided on the substrate, either coplanar or in a multi-layer construction, whereby the substrate is subjected to a collective etching step, or etching steps, to form each of the completely back-etched areas below the respective conductor paths.

In particular, the substrate is a silicon semiconductor substrate. It is preferred that the conductor paths are made of aluminum, copper, silver, gold, titanium, or the like, and are designed as conductor paths suitable for use in the high frequency field.

In a further embodiment, the dielectric insulating layers, with the exception of the membrane, can be made of an inorganic insulating material, for example, a silicon oxide, silicon dioxide, silicon with buried air gaps, silicon nitride, or the like.

Preferably, the dielectric insulating layer serving as a membrane is made of an organic insulation material, for example, an organic polymer material like, for example, benzocyclobutene (BCB), SiLK resin, SU-8 resist, polyimide, or the like.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
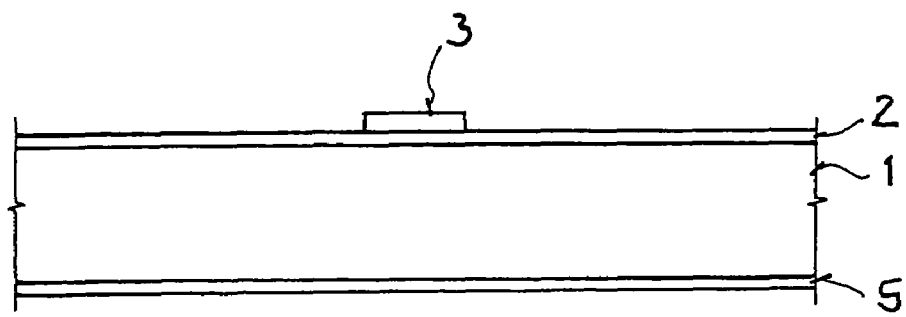
FIGS. 1a-1d each show a schematic cross-sectional view of a component to illustrate the individual steps of the method of the present invention according to a first embodiment of the present invention.

Identical reference numerals in the figures refer to substantially identical components, or to components having the same functions, unless noted otherwise.

With reference to FIGS. 1a to 1d, a preferred embodiment for the construction of a metallic conductor path 3 on a substrate 1 is illustrated in detail. FIGS. 1a to 1d illustrate a sequence of the basic method steps in accordance with a first embodiment of the present invention.

As shown in FIG. 1a, the starting point is a substrate 1. Preferably, the substrate 1 is a silicon semiconductor substrate, which can be relatively cost-efficiently fabricated, has a good thermal conductivity, and is suitable for integrated circuits in the high frequency field. The silicon substrate 1 can be a low-resistance or a high-resistance substrate, whereby high-resistance silicon substrates are more expensive.

To start with, for example, a first dielectric insulating layer 2 is formed, in a simple and conventional way, on the substrate 1, that is, on the top side of the substrate 1, which can, however, can be omitted in certain instances, and a further dielectric insulating layer 5 (henceforth referred to as "third dielectric insulating layer") on the bottom side of the substrate 1 using, for example, a low pressure chemical vapor deposition (LPCVD) procedure, or the like. The dielectric insulating layers 2 and 5 on the top and bottom sides of the substrate 1 are preferably made of an inorganic insulation material. Such an insulation material can be, for example, a silicon oxide, particularly a silicon dioxide, silicon nitride, silicon with buried air gaps, or the like.

In a subsequent step, as is also illustrated in FIG. 1a, a metallic conductor path 3 is formed on the first dielectric insulating layer 2 on the top side of the substrate 1, also utilizing a conventional metallization procedure. The main requirement of metallic materials for the conductor path 3 is the lowest possible electrical resistance. Furthermore, the material should have good adhesive properties and should not cause uncontrollable alloy reactions when coming in contact with the carrier substrate 1. Thus, aluminum, copper, gold, silver, titanium, platinum, or the like are particularly used as high-conductive materials. Due to the fact that it is easy to process, aluminum is particularly well suited for conductor path material.

In this way, for example, a conductor path 3, made of, for example, aluminum, is constructed on the first dielectric insulating layer 2 that is made of, for example, silicon dioxide. A combination such as this has been proven to be particularly beneficial because aluminum and silicon dioxide can be bonded in a simple way. In addition, aluminum has a relatively high electrical conductivity as compared to copper, silver, or gold.

In order to increase the resistance strength, a thin layer having a high resistance strength can be provided, for example, between the metallic conductor path 3 and the first dielectric insulating layer 2, which serves as a boundary layer between the conductor path 3 and the first dielectric insulating layer 2, or the substrate 1.

Figure 1B:
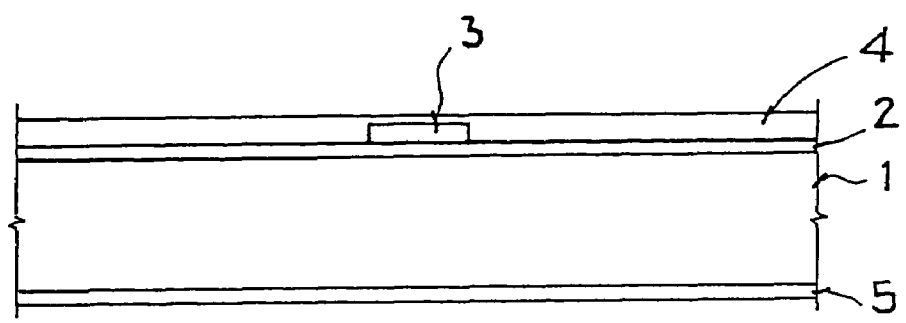

With reference to FIG. 1b, in a subsequent method step, an additional, second dielectric insulating layer 4 is formed, that is, deposited on the top side of the first dielectric insulating layer 2 so that it beneficially and completely covers the first dielectric insulating layer 2 and the conductor path 3 constructed thereon. It is preferred that the dielectric insulating layer 4 is a membrane and serves to support the conductor path 3 that is adhering to its bottom side, as is described in more detail therebelow.

Preferably, the membrane 4 is made of an organic insulation material, for example, an organic polymer material, particularly benzocyclobutene (BCB), SU-8, SiLK, polyimide, or the like. BCB polymers, polyimide and SU-8 have proven to be particularly beneficial for applications in the radio frequency and microwave fields. These materials have extremely low electrical leakage currents in surfaces and form excellent dielectric insulating layers, which is particularly advantageous with multilayer constructions. In addition, these materials have good mechanical properties and high frequency properties and can be formed on the conductor paths 3 and the existing first dielectric insulating layer 2 without much difficulty.

In the following section, SU-8, for example, is used for a membrane material, which is a photo-resistant material having a very high optical transparency. For example, the SU-8 membrane layer 4 is applied to the first dielectric insulating layer 2 and the metallic conductor path 3 using a centrifugal procedure, and is subsequently hardened by a heat treatment. This allows the insulating film, that is, the membrane 4 to firmly adhere to the first insulating layer 2 and the metallic conductor path 3, whereby a stable connection between the membrane 4 and the metallic conductor path 3 is ensured.

In addition, the second dielectric insulating layer 4 can be provided with a protective layer, which preferably is resistant to solvents used in subsequent method steps, particularly etching agents, thus protecting the SU-8 layer.

Figure 1C:
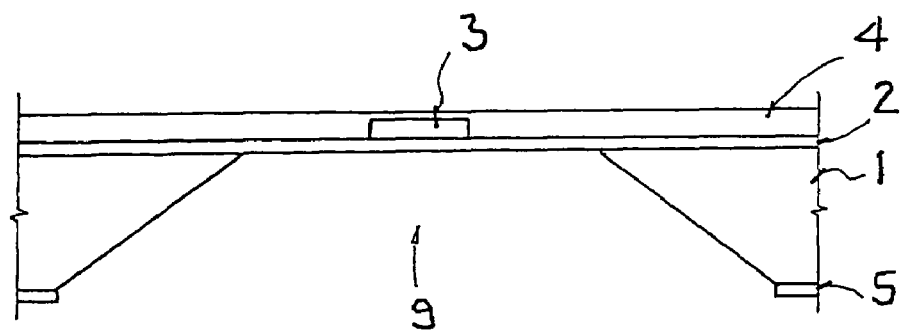

Subsequently, in a further method step, as is illustrated in FIG. 1c, the dielectric insulating layer 5 applied to the bottom side of the substrate 1 is structured by using a conventional procedure in such a way that an area of the substrate 1 that is wider than the width expansion of the metallic conductor path 3 is completely back-etched to the first insulating layer 2 utilizing, for example, a wet chemical etching procedure.

As is also shown in FIG. 1c, a diagonally back-etched area 9 below the metallic conductor path 3 is formed when a conventional anisotropic wet chemical etching procedure is applied. The first insulating layer 2 thereby serves as protection of the metallic conductor path 3 from the solvent that is used in the wet chemical etching procedure, for example, a KOH solution.

It is noted here that the present description is based on an unvarying orientation of the carrier substrate 1. However, in everyday application, it is preferred that for certain method steps the carrier substrate 1 is rotated by a carrier device in such a way that the side, which originally was the top, is turned upside down. This makes it easier to work on the original bottom side of the substrate 1.

Figure 1D:
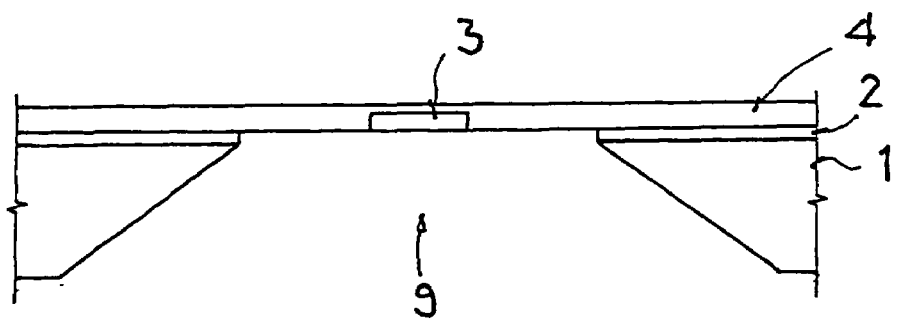

Lastly, in a further method step, as is illustrated in FIG. 1d, the remaining segments of the insulating layer 5 that is provided on the bottom side of the substrate as well as the segment of the first dielectric insulating layer 2, which covers the back-etched area 9, are removed by using a dry etching method, for example. In this way, the structure as illustrated in FIG. 1d is formed, whereby the metallic conductor path is freely suspended across the back-etched area 9 because the metallic conductor path 3 is supported by the membrane 4 due to its embedding in the membrane.

As a result of the back-etching of the substrate 1 below the metallic conductor path 3, substrate losses, parasitic losses and coupling losses due to the substrate 1 are prevented. Furthermore, the conductor path 3 is protected from external influences due to complete embedding in the membrane 4. This construction of the component is of particular advantage because the conductor path 3 is only connected with the membrane 4 and air in the back-etched area 9, whereby air has a favorable dielectric value $\in_{AIR}=1$. Thus, with the above-described production method, a beneficial component can be realized in a simple and cost-efficient manner by utilizing a standardized aluminum metallization.

Referring to FIGS. 2a to 2g, a second embodiment of a method of this invention for the construction of a metallic conductor path 3 on a substrate 1 is described in more detail below.

Since material selection, suitable etching steps or the like that were discussed in the first embodiment according to FIGS. 1a to 1d are equally applicable for the embodiment illustrated in FIGS. 2a to 2g, they will not be discussed in detail in the following section.

Figure 2A:
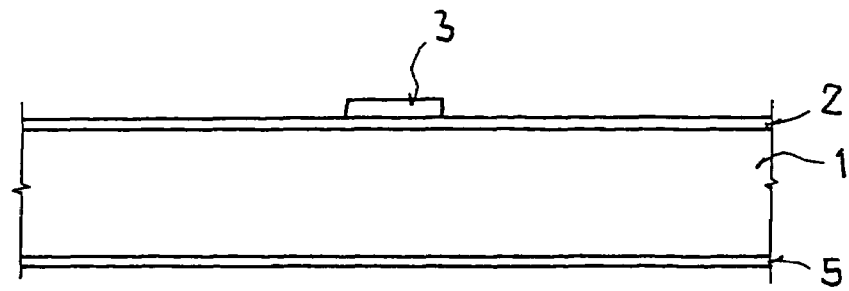
FIGS. 2a-2g each show a schematic cross-sectional view of a component to illustrate the individual steps of the method of the present invention according to a second embodiment of the present invention.

To start with, analogous to the previous embodiment and as illustrated in FIG. 2a, the substrate 1 is provided with a first dielectric insulating layer 2 on the top side of the substrate 1 and a further dielectric insulating layer 5 on the bottom side of the substrate 1, whereby under certain circumstances, these insulating layers can be omitted. Furthermore, the desired metallic conductor path 3 is also formed in a suitable location on the first dielectric insulation material 2, whereby it will be obvious to one skilled in the art that several conductor paths can be arranged in suitable locations, for example, side-by-side.

Figure 2B:
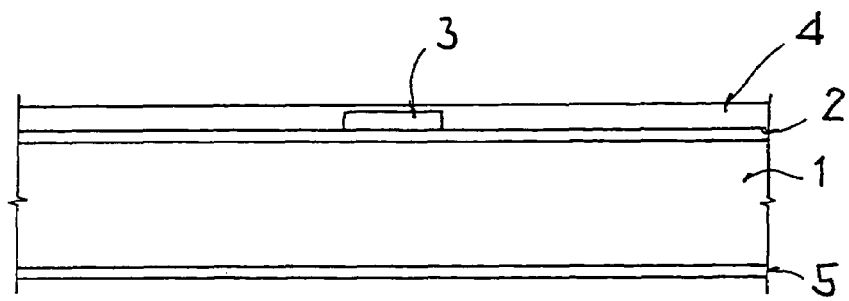

In a subsequent step, as illustrated in FIG. 2b, a membrane layer 4, for example, again SU-8, is applied to the first insulating layer 2 and the metallic conductor path 3 analogous to the previous embodiment.

In addition, a protective layer can be applied to the second dielectric insulating layer 4, which preferably is resistant to solutions that are used in further method steps, particularly etching agents, thus protecting the SU-8 layer.

Figure 2C:
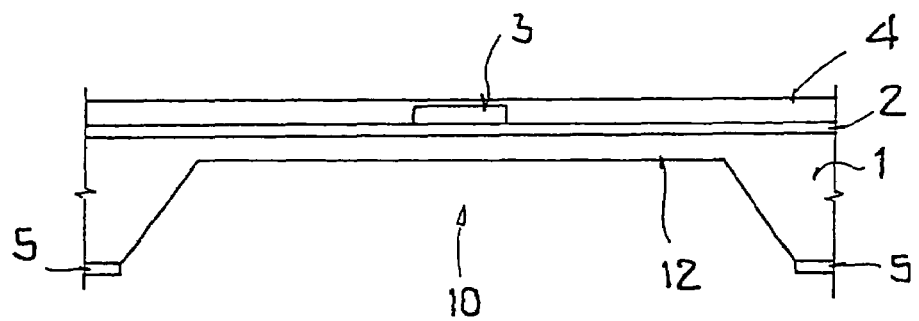

In contrast to the previous embodiment, in a further step as illustrated in FIG. 2c, the dielectric insulating layer 5 on the bottom side of the substrate 1 is then structured in such a way that by applying a wet chemical etching procedure, for example, using, a KOH solution, an area below the metallic conductor path 3 is only partially subjected to anisotropic back-etching. Thus, a first back-etched area 10 below the metallic conductor path is formed, which preferably is wider than the actual metallic conductor path 3.

Consequently, a thin substrate layer 12 separates the first back-etched area 10 from the first dielectric insulating layer 2 and the metallic conductor path 3 constructed thereon. The thin remaining substrate layer 12 can have a thickness of 20 to 30 μm, for example.

Figure 2D:
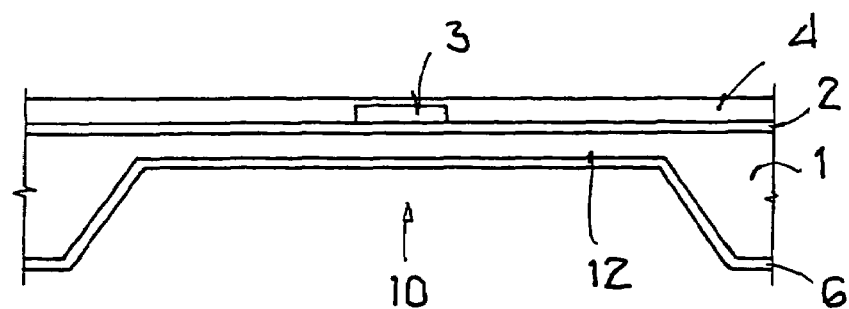

In a subsequent method step in accordance with FIG. 2d, a fourth dielectric insulating layer 6 is then formed on the inner areas of the first back-etched area 10. The fourth insulating layer 6 can be made of a material that is identical to the material of the dielectric insulating layers 2 and 5. As was previously discussed, silicon dioxide and silicon nitride are particularly preferred materials for the insulating layers with the exception of the membrane 4.

It will be obvious to one skilled in the art that the individual dielectric insulating layers 2, 5, and 6 can be made of different materials. In addition, the insulating layer 5 that is remaining on the bottom side of the substrate 1 can be completely removed, for example, by a dry etching procedure, prior to forming of the fourth dielectric insulating layer 6.

Figure 2E:
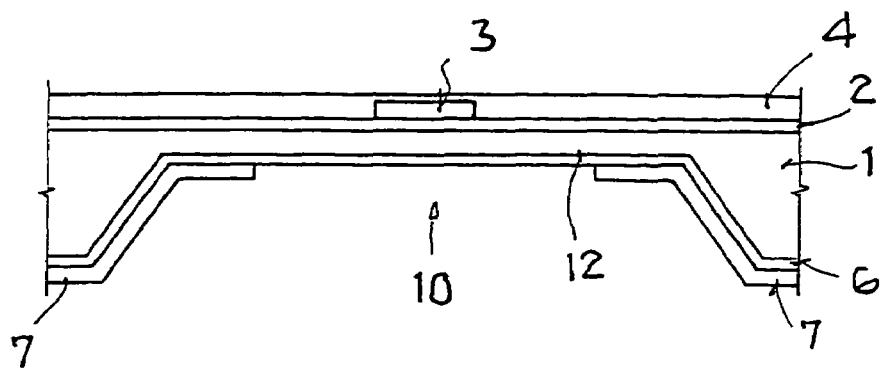

Subsequently, in a further step, preferably a photoresist material 7, for example, a negative photoresist, that is, a negative photolacquer 7, is vapor-deposited on the fourth insulating layer 6, as is illustrated in FIG. 2e. The photoresist layer 7 assists in a defined back-etching of a certain segment of the thin substrate layer 12 by developing a structured removal of the fourth dielectric insulating layer 6.

Figure 2F:
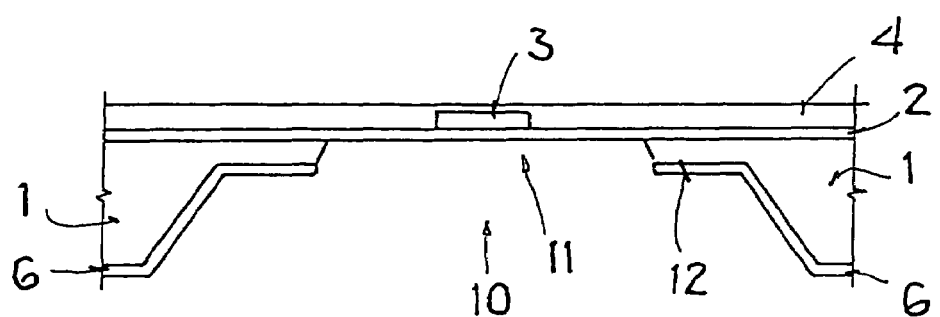

As is illustrated in FIG. 2f, the thin substrate layer 12 is thus completely back-etched to the first insulating layer 2 in order to form a predefined second back-etched area 11. It is beneficial for the second back-etched area 11 to be smaller in width than the first back-etched area 10 in order to form a staggered structure of the substrate 1 below the conductor path 3.

The first insulating layer 2, in turn, thereby serves as protection of the metallic conductor path 3 during the wet chemical etching process to back-etch the substrate 1 for forming the second back-etched area 11. The photoresist material can be completely rinsed off after the etching process, for example.

Figure 2G:
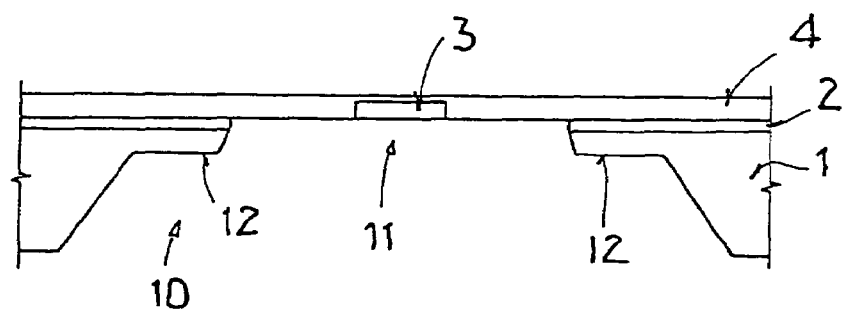

Lastly, in a further step as illustrated in FIG. 2g, both the fourth dielectric insulating layer 6 and the first dielectric insulating layer 2, which covers the second back-etched area 11, are removed applying, for example, a dry etching technique.

In this way, the structure of a component as illustrated in FIG. 2g is formed, whereby the substrate has a staggered structure such that the provided metallic conductor path 3, being freely suspended from the membrane 4 across the second back-etched area 11, is supported for a decoupling from the substrate 1.

According to the second embodiment, a component was constructed in two etching steps, whereby the metallic conductor path 3 is decoupled from the substrate 1, and whereby, in contrast to the first embodiment, thin substrate segments 12 below the membrane 4 are provided. Compared with the first embodiment, this improves the mechanical stability of the component, both having the same decoupling characteristics.

Figure 3:
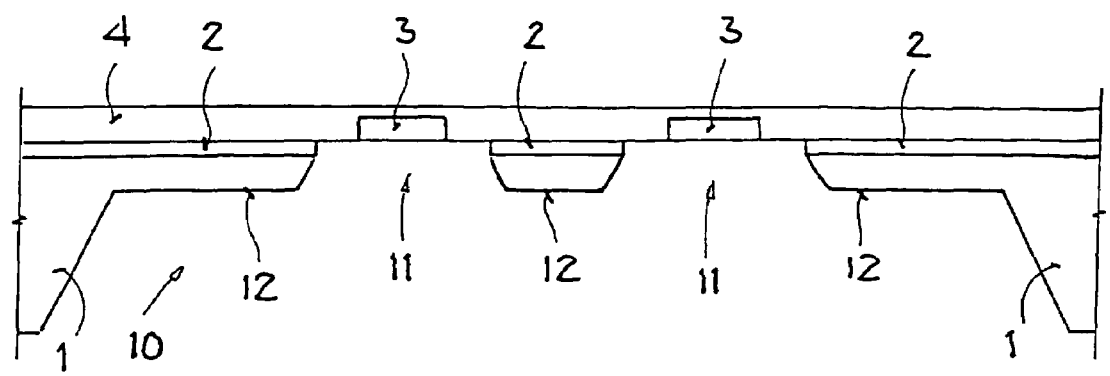
FIG. 3 shows a cross-sectional view of a component in accordance with an embodiment of the present invention.

FIG. 3 illustrates a schematic cross-sectional view of a component in accordance with a further embodiment of the present invention. In a case where two or more conductor paths 3 are arranged in close proximity to one another, it is beneficial to construct the component by using the method of the second embodiment in accordance with FIGS. 2a to 2g. As is shown in FIG. 3, a thin substrate layer 12 remains between the two conductor paths 3, which makes the component more stable.

Figure 4:
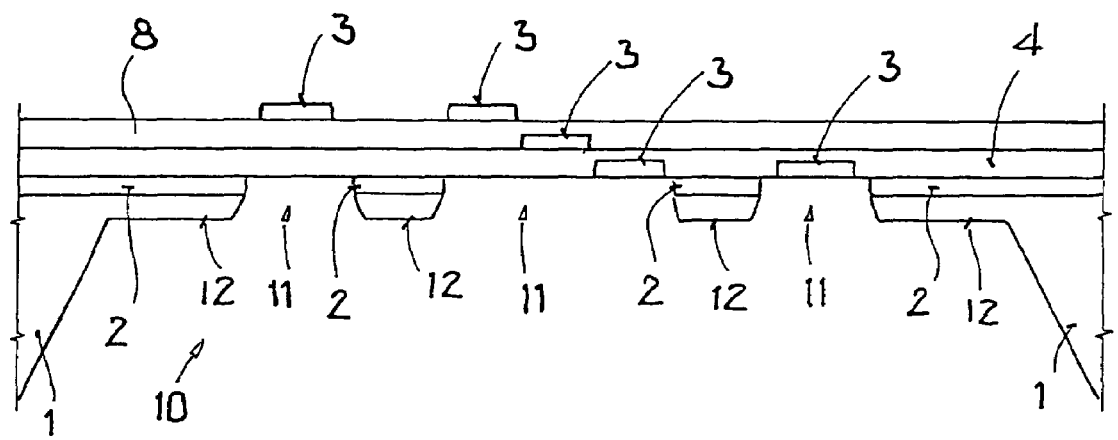
FIG. 4 shows a cross-sectional view of a component of the present invention in accordance with a further embodiment of the present invention.

FIG. 4 illustrates a schematic cross-sectional view of an additional component in accordance with a further embodiment of the present invention. As is shown in FIG. 4, multilevel structures can be constructed by applying the method of the present invention, whereby several conductor paths 3 are constructed and/or constructed thereon in various layers, for example, a membrane layer 3 and an organic dielectric intermediate layer 8.

The advantage of the method of this invention is, therefore, that initially, the conductor paths are constructed on the substrate in the multilevel structural design of FIG. 4, and that the substrate 1 can then be back-etched, either in a single etching step according to the embodiment in FIGS. 1a to 1d or in two consecutive etching steps according to the embodiment in FIGS. 2a to 2g, such that on the one hand, a stable construction of the component, and on the other hand, a decoupling and protection of the electrical conductor paths 3 through free suspension above the back-etched substrate areas is ensured.

Materials different from those previously described can be, for example, used for the insulating layers. Furthermore, different etching methods and/or structuring and development techniques may be used. It is critical, however, that the metallic conductor paths 3 adhere to the membrane 4 in such a way that they are suspended freely across a back-etched area of the substrate and that the metallic conductor paths 3 are completely embedded in the membrane, which ensures a decoupling of the conductor paths from the substrate 1 and protection of the metallic conductor paths 3.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A component comprising:
    a substrate having a portion thereof completely back-etched on a lower surface thereof;
    a first dielectric insulating layer being provided on an upper surface of the substrate, and which covers the portion of the substrate that is back-etched; and
    at least one conductor path, which is integratable into the first dielectric insulating layer, and which has a lower surface thereof adjacent to the portion of the substrate that is back-etched,
    wherein a second dielectric insulating layer is provided between the first dielectric insulating layer and the substrate, and
    wherein the substrate is completely back-etched directly to a surface of the first dielectric insulating layer.

2. The component according to claim 1, wherein the substrate is a silicon-containing semiconductor substrate, particularly monocrystalline silicon.

3. The component according to claim 2, wherein the second dielectric insulating layer is made of an inorganic insulation material, a silicon oxide, a silicon dioxide, a silicon nitride, or a silicon with buried air gaps.

4. The component according to claim 1, wherein the first dielectric insulating layer is a membrane made of an organic insulating material, an organic polymer material, benzocyclobutene, a SILK material, an SU-8 material, or a polyimide.

5. The component according to claim 1, wherein the at least one conductor path is made of aluminum, copper, silver, gold, or titanium.

6. The component according to claim 1, wherein the at least one conductor path is a conductor path that is used in a high frequency field.

7. The component according to claim 1, wherein the component is a semiconductor component.

8. The component according to claim 1, wherein the at least one conductor path is embedded into the first dielectric insulating layer.

9. The component according to claim 1, wherein the at least one conductor path is completely embedded into the first dielectric insulating layer.

10. The component according to claim 1, wherein the at least one conductor path is supported by the first dielectric insulating layer across the back-etched portion of the substrate.

11. The component according to claim 1, wherein the at least one conductor path is suspended from the first dielectric insulating layer across the back-etched portion of the substrate.

12. The component according to claim 1, wherein the at least one conductor path is embedded into the first dielectric insulating layer, except for the lower surface of the at least one conductor which is adjacent to the portion of the substrate that is back-etched.

13. The component according to claim 1, wherein the lower surface of the at least one conductor which is exposed to air in the portion of the substrate that is back-etched.

14. The component according to claim 1, further comprising:
  a third dielectric insulating layer provided above the first dielectric insulating layer, and
  at least one additional conductor that is embedded in the third dielectric insulating layer and that is adjacent to the portion of the substrate that is back-etched.

15. A component comprising:
  a substrate having a back-etched portion on a lower surface thereof;
  a first dielectric insulating layer provided above an upper surface of the substrate; and
  at least one conductor path that is adjacent to the back-etched portion of the substrate,
  wherein at least a portion of the at least one conductor path is embedded into the first dielectric insulating layer such that the at least one conductor path is supported by the first dielectric insulating layer across the back-etched portion of the substrate,
  wherein a second dielectric insulating layer is provided between the first dielectric insulating layer and the substrate, and
  wherein the substrate is completely back-etched directly to a surface of the first dielectric insulating layer.

16. The component according to claim 15, wherein the at least one conductor path is completely embedded into the first dielectric insulating layer.

17. The component according to claim 15, wherein the at least one conductor path is embedded into the first dielectric insulating layer, except for the lower surface of the at least one conductor which is adjacent to the back-etched portion of the substrate.

18. The component according to claim 15, wherein the at least one conductor path is imbedded in the first dielectric insulating layer, except for the lower surface of the at least one conductor which is exposed to air in the back-etched portion of the substrate.

19. The component according to claim 15, wherein the first dielectric insulating layer comprises a membrane made of an organic insulating material, an organic polymer material, benzocyclobutene, a SiLK material, an SU-8 material, or a polyimide.

20. The component according to claim 15, further comprising:
  a third dielectric insulating layer provided above the first dielectric insulating layer, and
  at least one additional conductor that is embedded in the third dielectric insulating layer and that is adjacent to the portion of the substrate that is back-etched.

* * * * *